(12) United States Patent
Williams

(10) Patent No.: US 9,876,526 B2
(45) Date of Patent: Jan. 23, 2018

(54) TUNABLE BANDPASS FILTER FOR COMMUNICATION SYSTEM

(71) Applicant: The Boeing Company, Chicago, IL (US)

(72) Inventor: John D. Williams, Decatur, AL (US)

(73) Assignee: The Boeing Company, Chicago, IL (US)

( * ) Notice: Subject to any disclaimer, the term of this patent is extended or adjusted under 35 U.S.C. 154(b) by 326 days.

(21) Appl. No.: 14/685,579

(22) Filed: Apr. 13, 2015

(65) Prior Publication Data

US 2016/0301376 A1 Oct. 13, 2016

(51) Int. Cl.
*H04B 1/50* (2006.01)
*H03H 7/01* (2006.01)
*H01P 1/203* (2006.01)

(52) U.S. Cl.
CPC .......... *H04B 1/50* (2013.01); *H01P 1/20345* (2013.01); *H03H 7/0115* (2013.01); *H03H 7/0123* (2013.01); *H03H 7/0161* (2013.01); *H03H 2250/00* (2013.01)

(58) Field of Classification Search
CPC combination set(s) only.
See application file for complete search history.

(56) References Cited

U.S. PATENT DOCUMENTS

| | | | |
|---|---|---|---|
| 8,922,301 B1 * | 12/2014 | Williams | H03H 7/175 333/185 |
| 9,722,566 B1 | 8/2017 | Williams et al. | |
| 2008/0242239 A1 * | 10/2008 | Wilson | H04B 1/0007 455/83 |
| 2010/0164651 A1 * | 7/2010 | Erb | H01P 1/20345 333/204 |
| 2014/0161005 A1 * | 6/2014 | Laurent-Michel | H04B 1/525 370/281 |

OTHER PUBLICATIONS

Yaghmaee, P., et al. "Frequency tunable S-band resonator using nematic liquid crystal." Electronics letters 48.13 (2012): 798-800.*
Kamali-Sarvestani et al., "Design and Fabrication of Monolithic High Quality Factor RF-Solenoids Using Dielectric Substrate," pp. 76-90, Microwave Journal, vol. 54, No. 11, Nov. 2011.

(Continued)

*Primary Examiner* — Yuwen Pan
*Assistant Examiner* — Zhitong Chen
(74) *Attorney, Agent, or Firm* — Haynes and Boone, LLP

(57) ABSTRACT

Systems and methods according to one or more embodiments are provided for filtering of communication signals. Filtering may be implemented, for example, as a bandpass filter that is selectively tuned across a communication system frequency range to more effectively utilize the communication system bandwidth. In one example, a system includes a printed wiring board (PWB) and a filter implemented in the PWB. The filter includes first and second ports, an inductor comprising a plurality of vias extending through the PWB and a plurality of conductors connecting the plurality of vias to provide a plurality of coils between the first and second ports, and a plurality of capacitors disposed within the PWB. Additional systems and methods are also provided.

18 Claims, 8 Drawing Sheets

(56) References Cited

OTHER PUBLICATIONS

Kamali-Sarvestani et al., "Fabrication of High Quality Factor RF-Solenoids Using Via Structures," pp. 1-4, IEEE Wireless and Microwave Technology Conference, Clearwater FL, Apr. 2011.

Kamali-Sarvestani et al., "New High Quality Factor Solenoid Based Tuned Resonator," pp. 1-4, IEEE International Microwave Symposium, Baltimore, MD, Jun. 2011.

Kamali-Sarvestani et al., "Fabrication of High Quality Factor RF-Resonator Using Embedded Inductor and Via Capacitor," pp. 2283-2287, Conference of the IEEE Industrial Electronic Society (IECON), Phoenix, AZ, Nov. 2010.

Namkung et al., "Sensing Characteristics of Chemical Agents by Using Liquid Crystal-Based Chemical and Biological Sensors," pp. 1-2, Conference on Lasers and Electro-Optics, San Jose, CA, May 2010.

Yaghmaee et al., "Frequency tunable S-band resonator using nematic liquid crystal," Electronic Letters, vol. 48, No. 13, pp. 1-2, Jun. 2012.

David Vye, "Divine Innovation: 10 Innovations Changing the Future of Passive and Control Components," pp. 22-43, Microwave Journal, vol. 54, No. 11, Nov. 2011.

Cao et al., "A Fourth-Order Lumped-Element Bandpass Filter Constructed on Multilayer Substrates," pp. 745-747, IEEE Microwave and Wireless Component Letters, vol. 24, No. 11, Nov. 2014.

Cho et al., "0.7-1-GHz Reconfigurable Bandpass-to-Bandstop Filter with Selectable 2- and 4-Pole Responses," pp. 2626-2632, IEEE Transactions on Microwave Theory and Techniques, vol. 62, No. 11, Nov. 2014.

Rosenberg et al., "Compact Multi-Port Power Combination/Distribution with Inherent Bandpass Filter Characteristics," pp. 2659-2672, IEEE Transactions on Microwave Theory and Techniques, vol. 62, No. 11, Nov. 2014.

\* cited by examiner

TUNABLE BANDPASS FILTER FOR COMMUNICATION SYSTEM

TECHNICAL FIELD

The invention relates generally to communication systems and, more particularly, to filtering of communication signals.

BACKGROUND

In the field of antenna-based communication and radar systems, there is an ongoing effort to improve signal quality and channel isolation. In some cases, individual channels may be separately filtered in furtherance of these improvements.

For example, some existing systems may employ analog filters implemented using discrete components patterned on the surface of a dielectric substrate. Unfortunately, these filters require a large volume and have limited adaptability to radar and communication systems front end filter requirements due to parasitic capacitance and poor inductance at frequencies in the range of front end filter applications. Other systems may employ filters with mechanical moving parts. These filters also require a large volume, utilize complex manufacturing processes, and are susceptible to fatigue causing failures.

As set forth above, these various prior approaches fail to provide filters in an efficient manner suitable for many modern communication and radar systems. Accordingly, there is a need for an improved filter implementation that provides a high degree of signal performance without excessive volume.

SUMMARY

Systems and methods are disclosed herein providing an improved approach to filtering signals for use in two way radio frequency communication systems and radar systems. In some embodiments a filter is implemented with a capacitively coupled inductor coil embedded in a high frequency dielectric substrate. In one example, tunable capacitors are implemented to produce a dual bandpass filter. The filter is tunable by electrical modification of dielectric constants associated with the capacitors through application of a low frequency alternating current (AC) bias voltage to liquid crystal material within the capacitors. The effect of the change in dielectric constants is to modify the capacitances and thereby cause a shift in the resonant frequencies of the filter. In another example, additional capacitors are incorporated by patterning capacitive gaps on substrate conductors to produce a single bandpass filter.

In one embodiment, a system includes a printed wiring board (PWB); and a filter implemented in the PWB, the filter comprising: first and second ports, an inductor comprising a plurality of vias extending through the PWB and a plurality of conductors connecting the plurality of vias to provide a plurality of coils between the first and second ports, and a plurality of capacitors disposed within the PWB.

In another embodiment, a method includes providing a printed wiring board (PWB); providing a filter implemented in the PWB, the filter comprising: first and second ports, an inductor comprising a plurality of vias extending through the PWB and a plurality of conductors connecting the plurality of vias to provide a plurality of coils between the first and second ports, and a plurality of capacitors disposed within the PWB; receiving a signal at the first port; applying, by the filter, a bandpass frequency response to the received signal to generate a filtered signal; and providing the filtered signal to the second port.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
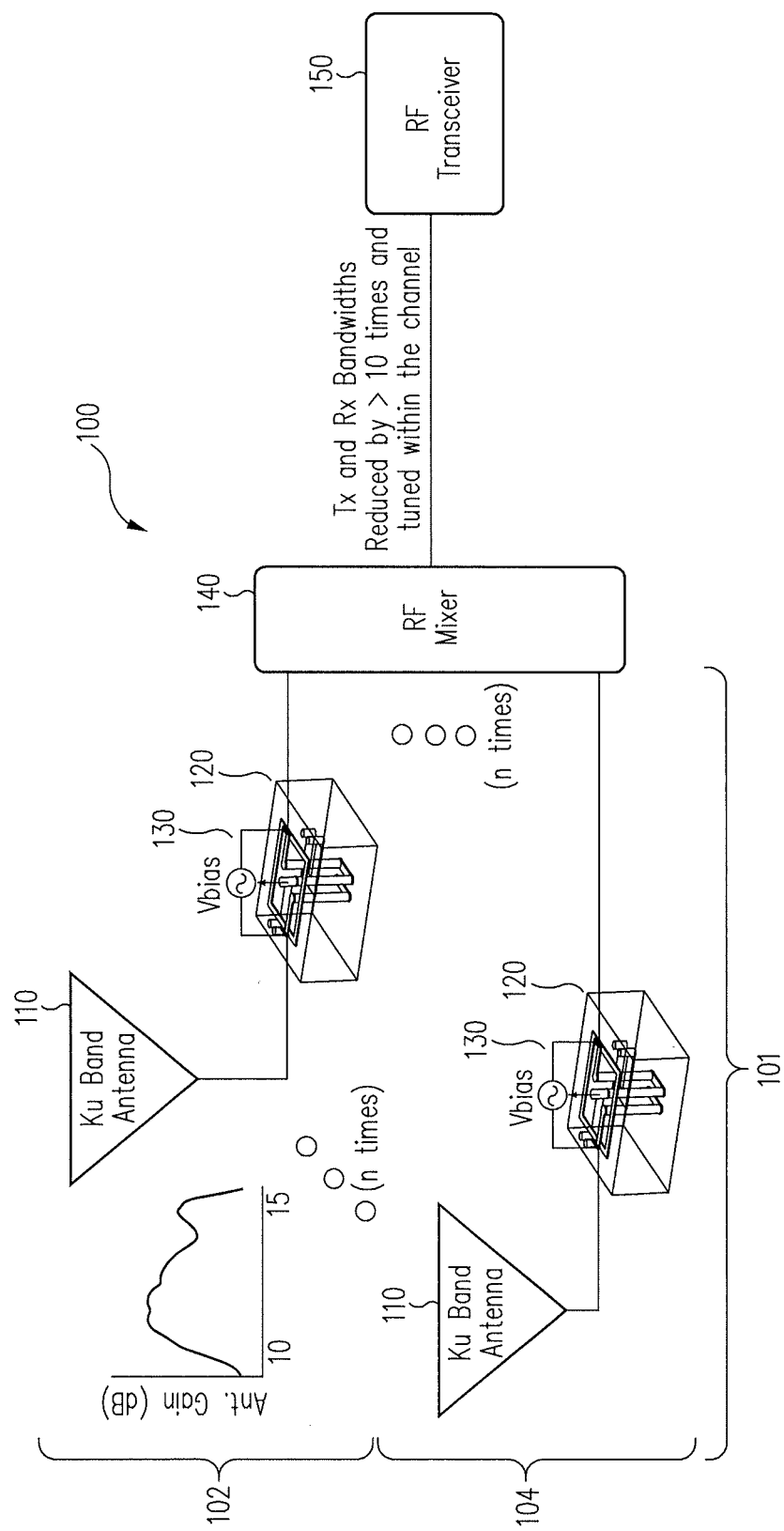
FIG. 1 illustrates a block diagram of a communication system in accordance with an embodiment of the disclosure.

FIG. 1 illustrates a block diagram of a communication system 100 in accordance with an embodiment of the disclosure. Communication system 100 includes a plurality of signal paths 101, two of which are identified as signal paths 102 and 104. Any desired number of signal paths 101 may be provided.

Each signal path 101 includes an antenna 110 (e.g., a Ku band antenna in some embodiments), a filter 120, and a bias circuit 130. Each antenna 110 is electrically coupled to a corresponding filter 120 which is electrically coupled to a radio frequency (RF) mixer 140. RF mixer 140 is electrically coupled to an RF transceiver 150.

In some embodiments, each signal path 101 of communication system 100 provides bidirectional communication with a receive channel (designated Rx) from antenna 110 through filter 120 to RF mixer 140, and a transmit channel (designated Tx) from RF mixer 140 through filter 120 to antenna 110.

In some embodiments, each filter 120 may be implemented as a bandpass filter that is selectively tuned across the antenna frequency range to more effectively utilize the antenna bandwidth. In this regard, each filter 120 may be used to narrow the bandwidth used by its associated receive and transmit channels. Narrowing the channel bandwidths provides for a reduction in the allotted frequency space between different signal paths 101 and different receive and transmit channels within the signal paths 101. This results in a significant increase in the number of discrete channels that may be provided between RF mixer 140 and RF transceiver 150. This also results in a significant improvement in the quality of signals received by the RF transceiver 150 from each antenna 110, resulting in filtered data that can be amplified to larger signal to noise ratios while demonstrating fewer bit errors within communication system 100.

In some embodiments, each filter 120 may provide different passbands for its associated receive and transmit channels. As a result, each signal path 101 may support simultaneous bidirectional signal transmission and reception of signals through its different passbands. As further discussed herein, bias circuit 130 may selectively provide a bias signal (e.g., bias voltage) across filter 120 to adjust the frequency response characteristics of the passbands.

Figure 2:
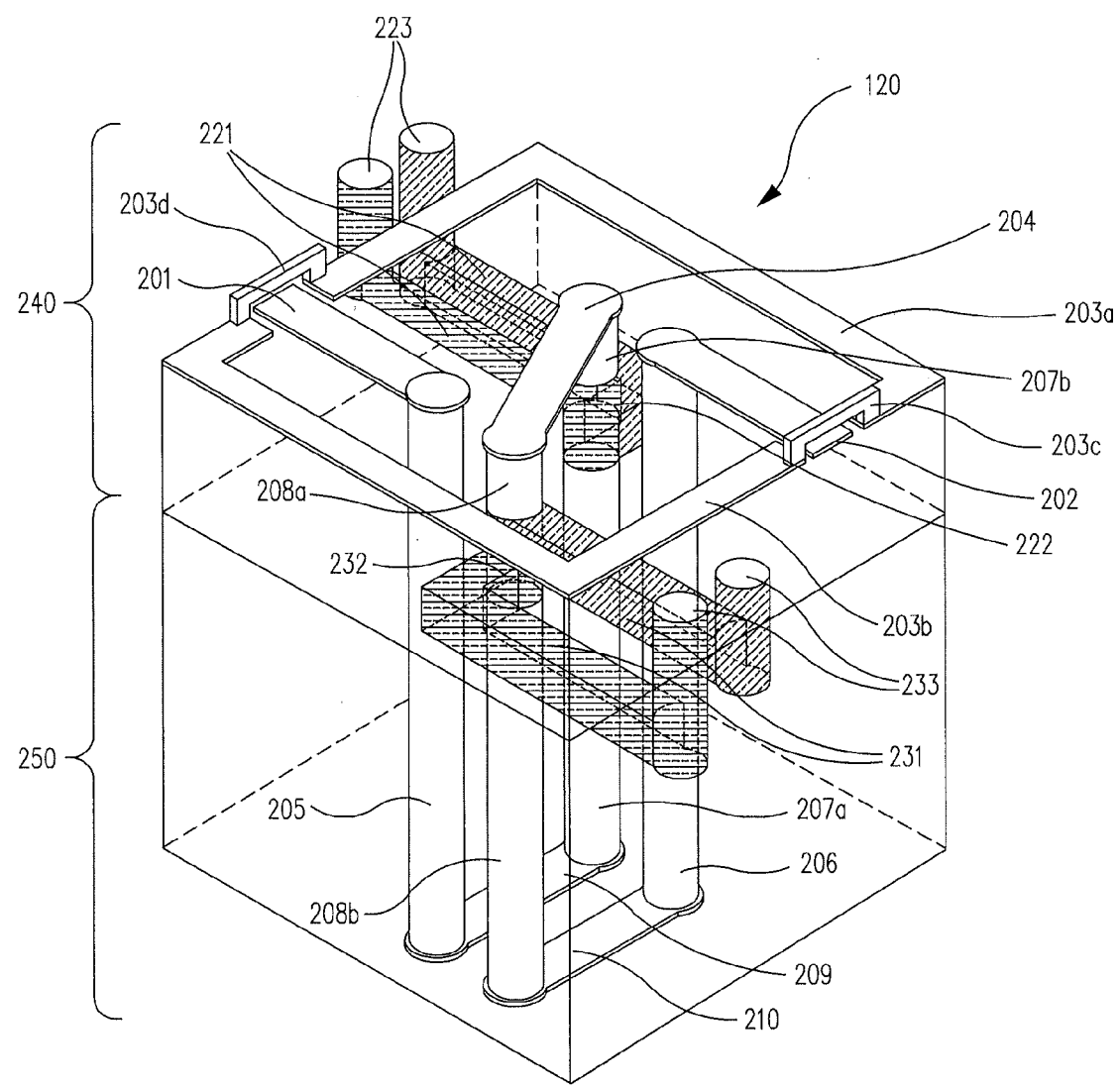
FIG. 2 illustrates a tunable dual bandpass filter in accordance with an embodiment of the disclosure.

FIG. 2 illustrates one of filters 120 in accordance with an embodiment of the disclosure. In some embodiments, filter 120 is embedded in a high frequency dielectric substrate material. In this manner, the printed wiring board (PWB) comprises a plurality of layers of dielectric substrate material bonded together. For example, in FIG. 2, filter 120 is embedded within two high frequency microwave substrates 240 and 250 bonded together to form a PWB. Although particular locations and implementations of various filter components are described herein, other embodiments are also contemplated. For example, in some embodiments, filter 120 may be embedded into existing layers of a multi-layer printed wiring board assembly.

Filter 120 implements an inductor and two capacitors which collectively provide a filter circuit to attenuate the frequency bands of various signals passed therethrough. In some embodiments, the inductor and capacitors may be provided in one or more substrates 240/250 of the PWB permit filter 120 to achieve high density packaging while minimizing parasitic capacitance that would otherwise result in degradation of the filter's resonant mode.

Regarding the inductor, filter 120 includes conductors 201-204 positioned on a top surface of substrate 240, a plurality of vias 205-208 extending through substrates 240 and 250, and conductors 209-210 positioned on a bottom surface of substrate 250. As shown, conductors 201-204, vias 205-208, and conductors 209-210 are physically configured to implement a plurality of coils (e.g., turns) which provide an inductor. In some embodiments, conductors 201-204, conductors 209-210, and vias 205-208 comprise copper, although other conductive materials are possible in other embodiments. Filter 120 also includes conductors 203a and 203b implemented as ground planes connectively joined by interfacing members 203c and 203d.

Regarding the capacitors, filter 120 includes capacitors 221 and 231 implemented, for example, by liquid crystal. In this regard, voids (e.g., tubes) may be provided in substrates 240 and 250 and filled with liquid crystal material. In some embodiments, a nematic liquid crystal material is used. However, other types of liquid crystal material and/or other media may be used. As shown, capacitors 221 and 231 may intersect with vias 207 and 208 to separate the vias into portions 207a/207b and 208a/208b, respectively (e.g., providing gaps 222 and 232 filled with liquid crystal material in vias 207 and 208 as shown).

Various types of fluids may be used having different associated permittivities which change the capacitance exhibited by filter 120. For example, in some embodiments, different fluids with different permittivities may be introduced into gaps 222 and/or 232 at selected time intervals. In this regard, the different fluids may be selectively pumped through channels in substrate 240 and/or 250 to provide particular fluids in gaps 222 and/or 232 at particular time intervals during which a particular filter response is desired. For example, a pump may be used to provide fluid to the channels through apertures 223 and/or 233.

In some embodiments, the voids may be provided by cutting (e.g., by a laser or other cutting tool) channels in substrate 240 and/or 250 across vias 207 and 208. As shown, in some embodiments, such channels may extend up to a top surface of substrate 240 where they may end with apertures 223/233. Liquid crystal material may be introduced into the voids through apertures 223/233. Apertures 223/233 may then be sealed to maintain the liquid crystal material within the voids, thus providing capacitors 221/231. In various embodiments, the size and position of the voids may be adjusted (e.g., to adjust the size and position of gaps 222/232 provided in vias 207 and 208).

Filter 120 provides a signal path between antenna 110 and RF mixer 140 through the following components: conductor 201, via 205, conductor 209, via 207a, capacitor 221, via 207b, conductor 204, via 208a, capacitor 231, via 208b, conductor 210, via 206, and conductor 202. In this regard, signals from antenna 110 are received by filter 120 at conductor 201, passed through filter 120 to conductor 202, and passed from filter 120 to RF mixer 140. Conversely, signals from RF mixer 140 are received by filter 120 at conductor 202, passed through filter 120 to conductor 201, and passed from filter 120 to antenna 110 for transmission.

Bias circuit 130 may selectively provide a bias voltage across conductors 201 and 202 to adjust the frequency response characteristics of filter 120. For example, in some embodiments, the bias voltage may be an alternating current (AC) signal having a magnitude in a range of approximately −5 volts to approximately +5 volts, and a frequency range of less than approximately 1 Hz to approximately 30 kHz. The applied bias voltage changes the permittivity of the liquid crystal material of capacitors 221/231, thus modifying the dielectric constants associated with capacitors 221/231, and therefore their capacitances. This causes a shift in the frequency response of filter 120 (e.g., thus tuning filter 120). The use of bias circuit 130 permits filter 120 to be selectively tuned without mechanical moving parts, thus increasing the reliability of filter 120.

Figure 3:
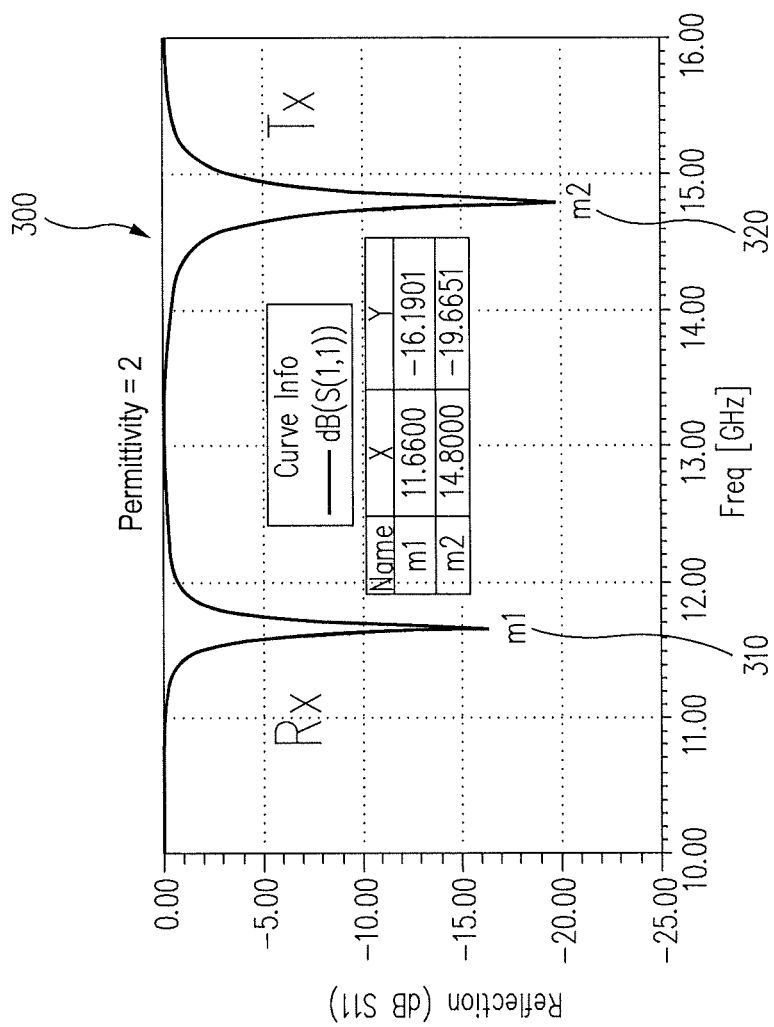
FIGS. 3 and 4 illustrate several tunable dual bandpass filter frequency responses in accordance with embodiments of the disclosure.
Figure 4:
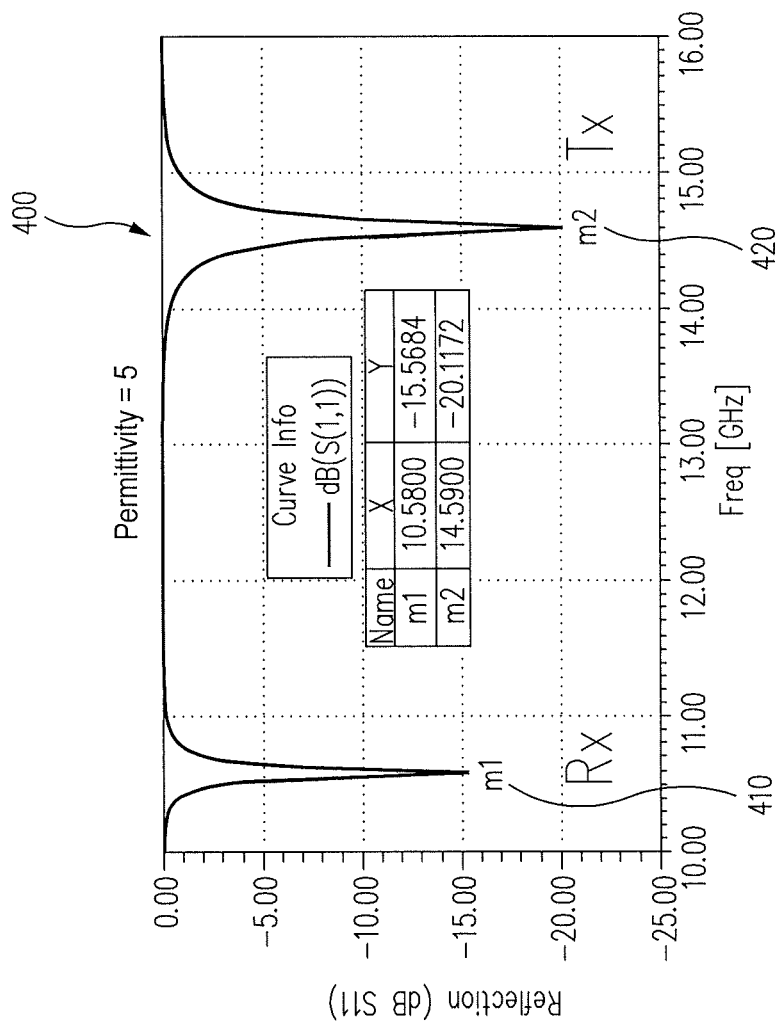

FIGS. 3 and 4 illustrate dual bandpass frequency responses of filter 120 under different bias voltage conditions in accordance with embodiments of the disclosure. For example, in FIG. 3, plot 300 identifies the frequency response of filter 120 while bias circuit 130 applies an appropriate bias voltage to change the permittivity of liquid crystal material of capacitors 221/231 to a value of approximately 2. This results in filter 120 exhibiting two narrow bandpass peaks 310 and 320 (e.g., lower values of the reflection coefficient S11 indicate more signal is passed through filter 120 at those frequencies). In this regard, signals received from antenna 110 (e.g., passed from antenna 110 through filter 120 to RF mixer 140 in the receive channel) are bandpass filtered in accordance with peak 310 (e.g., having a bandpass frequency range of approximately 300 MHz). Signals received from RF mixer 140 (e.g., passed from RF mixer 140 through filter 120 to antenna 110 in the transmit channel) are bandpass filtered in accordance with peak 320 (e.g., having a bandpass frequency range of approximately 400 MHz). As shown, the frequency separation between peaks 310 and 320 is greater than 3 GHz. As a result, the transmit and receive signals may be separated from each other through the bidirectional operation of filter 120.

As another example, in FIG. 4, plot 400 identifies the frequency response of filter 120 while bias circuit 130 applies an appropriate bias voltage to change the permittivity of liquid crystal material of capacitors 221/231 to a value of approximately 5. This results in filter 120 exhibiting two narrow bandpass peaks 410 and 420. In this regard, signals received from antenna 110 are bandpass filtered in accordance with peak 410 (e.g., having a bandpass frequency range less than approximately 200 MHz). Signals received from RF mixer 140 are bandpass filtered in accordance with peak 420 (e.g., having a bandpass frequency range of approximately 400 MHz). As shown, the frequency separation between peaks 410 and 420 is greater than 4 GHz. Thus, the transmit and receive signals may again be separated from each other through the bidirectional operation of filter 120.

Comparison of plots 300 and 400 shows a frequency shift of the receive channel peak from approximately 11.66 GHz (peak 310) to approximately 10.58 GHz (peak 410) which corresponds to a frequency shift of approximately 1.08 GHz. Further comparison shows a frequency shift of the transmit channel peak from approximately 14.80 GHz (peak 320) to approximately 14.59 GHz (peak 420) which corresponds to a frequency shift of approximately 0.21 GHz.

Figure 5:
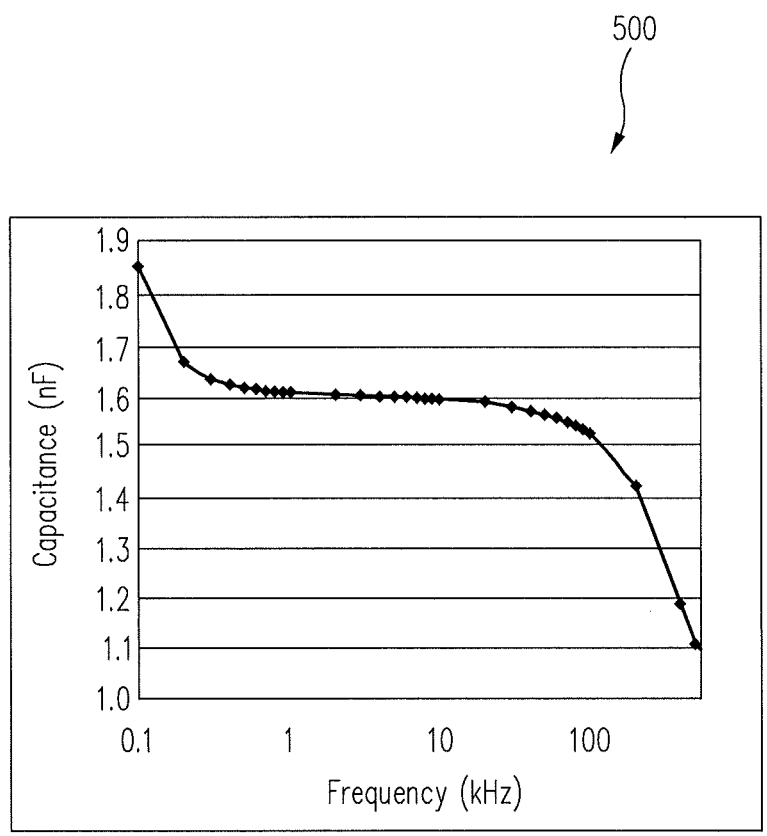
FIG. 5 illustrates changes in capacitance as a function of frequency for nematic liquid crystal in accordance with an embodiment of the disclosure.

FIG. 5 illustrates a plot 500 of changes in capacitance as a function of frequency for nematic liquid crystal in accordance with an embodiment of the disclosure. In this regard, the nematic liquid crystal exhibits a repeatable change of capacitance that is over a frequency range of less than approximately 1 Hz to approximately 100 KHz.

Figure 6:
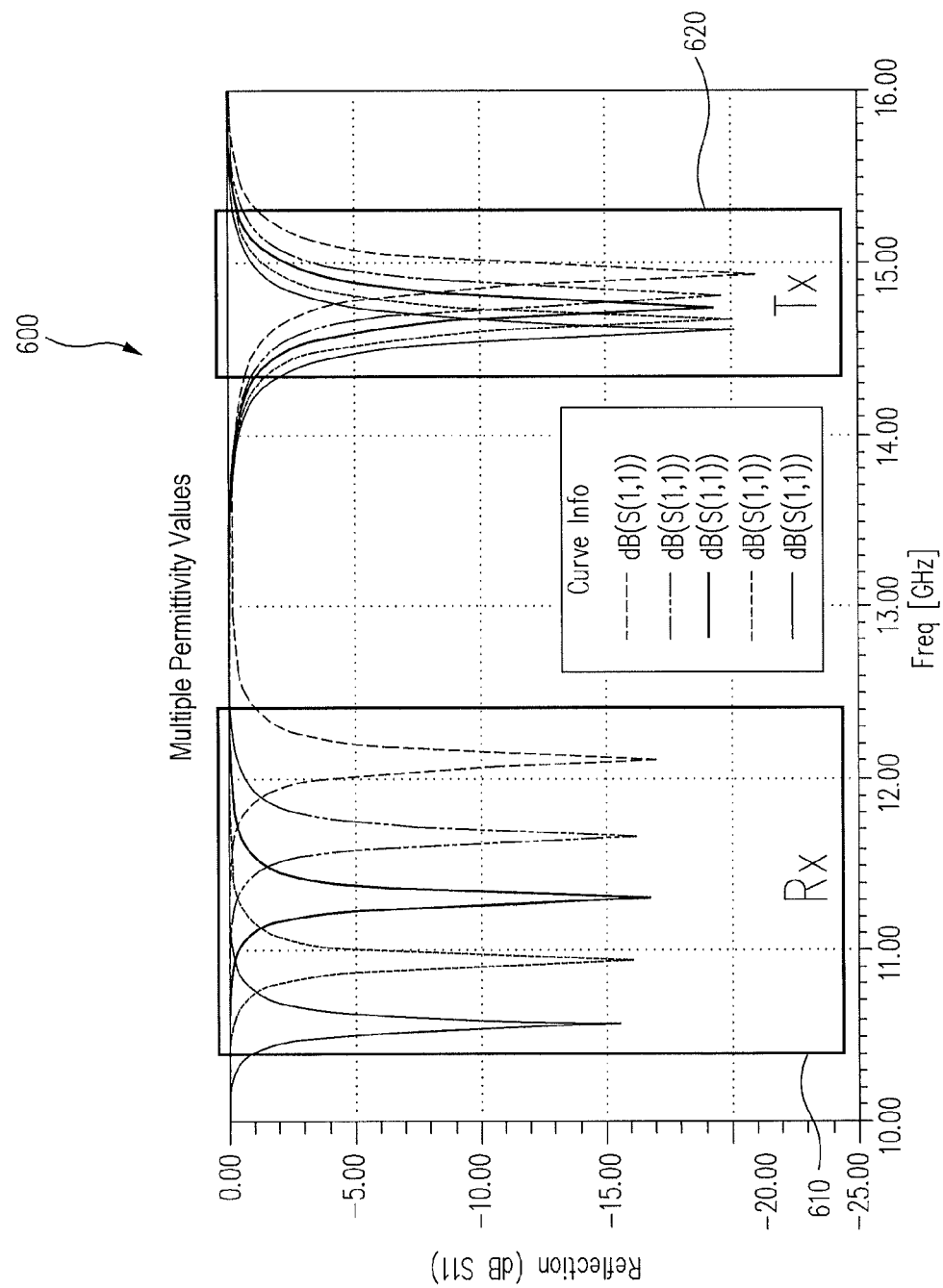
FIG. 6 illustrates additional tunable dual bandpass filter frequency responses in accordance with embodiments of the invention.

FIG. 6 illustrates a plot 600 of additional tunable dual bandpass filter frequency responses in accordance with embodiments of the invention. In plot 600, various peaks 610 and 620 are provided for the receive and transmit channels, respectively. Each pair of peaks (e.g., one of peaks 610 and one of peaks 620) is associated with a different permittivity value of the liquid crystal material of capacitors 221/231 caused by a different bias voltage applied by bias circuit 130.

As shown in FIG. 6, a plurality of receive signals may be distributed over peaks 610 falling within an overall receive bandwidth of approximately 2 GHz. A plurality of transmit signals may be distributed over peaks 620 falling within an overall receive bandwidth of approximately 1 GHz.

Figure 7:
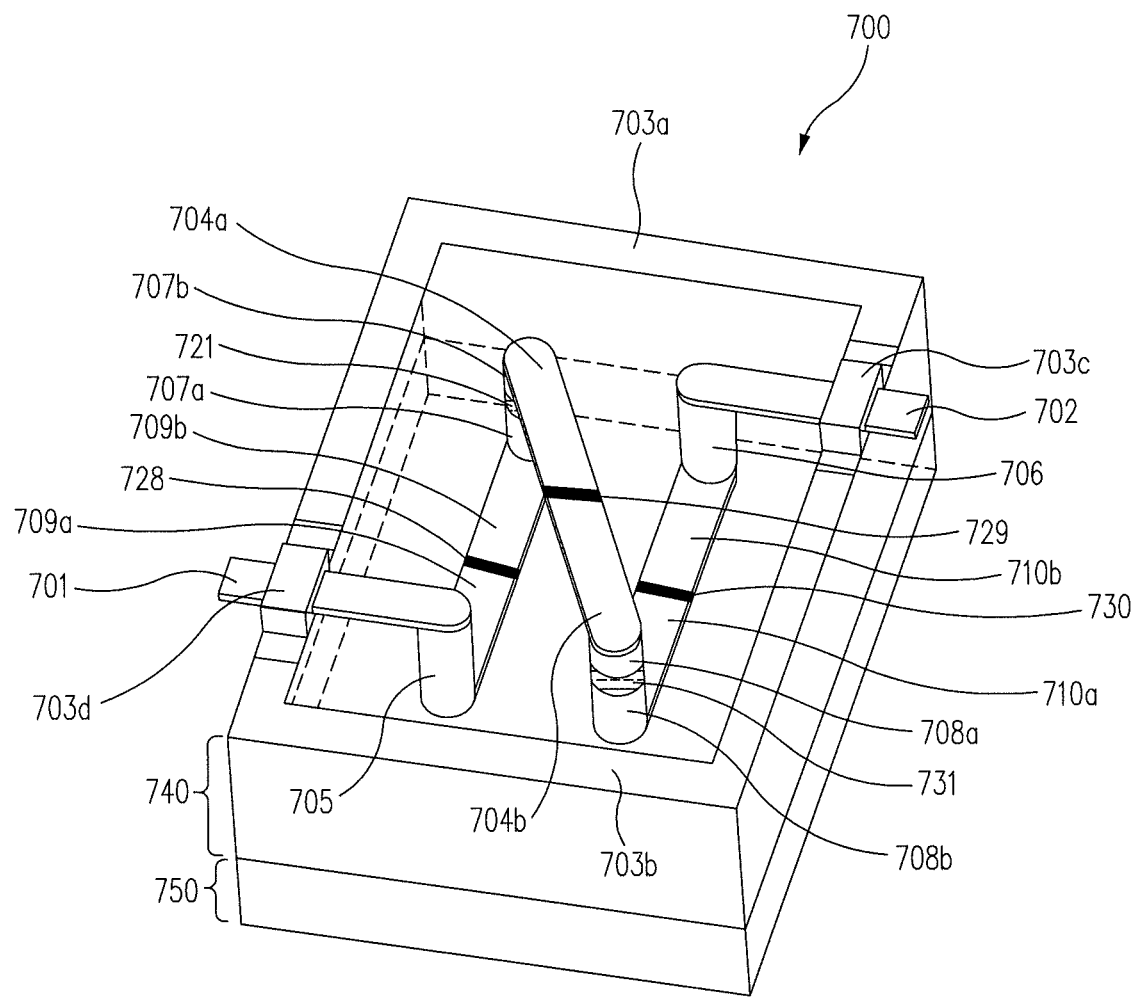
FIG. 7 illustrates a tunable single bandpass filter in accordance with an embodiment of the disclosure.

FIG. 7 illustrates a tunable single bandpass filter 700 in accordance with an embodiment of the disclosure. In some embodiments, filter 700 may be used in place of filter 120 discussed herein. In some embodiments, filter 700 is embedded in a high frequency microwave substrate similar to filter 120. For example, in FIG. 7, filter 700 is embedded within two high frequency microwave substrates 740 and 750 bonded together to form a PWB. Other implementations are also contemplated similar to filter 120.

Filter 700 implements an inductor and five capacitors which collectively provide a filter circuit to attenuate the frequency bands of various signals passed therethrough. Regarding the inductor, filter 700 includes conductors 701-704 positioned on a top surface of substrate 740, a plurality of vias 705-708 extending through substrates 740 and 750, and conductors 709-710 positioned on a bottom surface of substrate 750. As shown, conductors 701-704, vias 705-708, and conductors 709-710 are physically configured to implement a plurality of coils (e.g., turns) which provide an inductor. In some embodiments, conductors 701-704, conductors 709-710, and vias 705-708 comprise copper, although other conductive materials are possible in other embodiments. Filter 700 also includes conductors 703a and 703b implemented as ground planes connectively joined by interfacing members 703c and 703d.

Regarding the capacitors, filter 700 includes capacitors 721 and 731 implemented, for example, by liquid crystal in the same or similar manner as capacitors 221 and 231 discussed herein. As shown, capacitors 721 and 731 may intersect with vias 707 and 708 to separate the vias into portions 707a/707b and 708a/708b, respectively (e.g., providing gaps and filled with liquid crystal material in vias 707 and 708 as shown).

Further regarding the capacitors, filter 700 includes capacitors 728, 729, and 730 implemented, for example, by a gap within the conductors and/or vias. In the illustrated embodiment, capacitors 728, 729, and 730 may intersect with conductors 709, 704, and 710 to separate the conductors into portions 709a/709b, 704a/704b, and 710a/710b, respectively (e.g., providing capacitive gaps). In some embodiments, the gap is air to form capacitors 728, 729, and 730. However, other dielectrics (e.g., dielectric materials) such as, for example, duroid or plastic may be used to fill the gap, thus providing one or more dielectric gaps to form capacitors 728, 729, and 730.

In some embodiments, the gaps may be provided by cutting (e.g., by laser or other cutting tool) channels across conductors 704, 709, and 710. As shown, in some embodiments, such channels may extend across the width of the conductor, thus providing capacitors 728/729/730. In various embodiments, the size and position of the gaps may be adjusted (e.g., to adjust the size and position of the gaps provided across conductors 704, 709 and 710).

Filter 700 provides a signal path through the following components: conductor 701, via 705, conductor 709a, capacitor 728, conductor 709b, via 707a, capacitor 721, via 707b, conductor 704a, capacitor 729, conductor 704b, via 708a, capacitor 731, via 708b, conductor 710a, capacitor 730, conductor 701b, via 706, and conductor 702. In this regard signals are received at conductor 701 and passed through filter 700 to conductor 702.

Bias circuit 130 may selectively provide a bias voltage across conductors 701 and 702 to adjust the frequency response characteristics of filter 700 in a similar manner as discussed with regard to filter 120.

Figure 8:
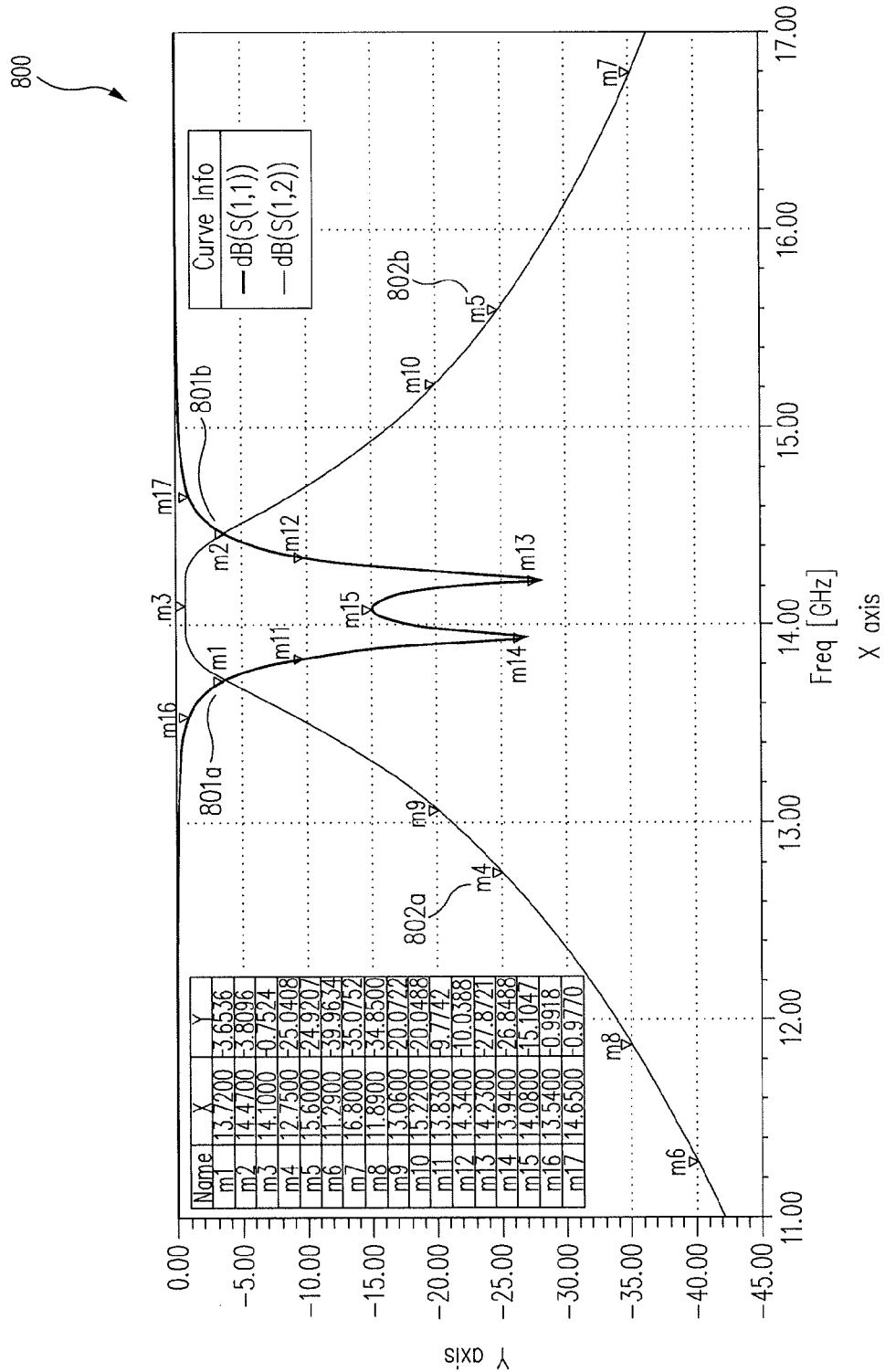
FIG. 8 illustrates a tunable single bandpass filter frequency response in accordance with an embodiment of the disclosure.

FIG. 8 illustrates a bandpass frequency response of filter 700 in accordance with an embodiment of the disclosure. In this regard, a plot 800 identifies the frequency response (X axis) and power (Y axis) of filter 700 in a radar system. Markers 801a-b identify that at a power of −3 dB, the filter frequency bandwidth is approximately 0.7 GHz. Markers 802a-b identify that at a power of −25 dB, the filter frequency bandwidth is approximately 3.0 GHz. In some embodiments, filter 700 may exhibit the same bandpass frequency response for signals received from antenna 110 (e.g., passed from antenna 110 through filter 700 to RF mixer 140 in the receive channel) and for signals received from RF mixer 140 (e.g., passed from RF mixer 140 through filter 700 to antenna 110 in the transmit channel).

Embodiments described above illustrate but do not limit the invention. For example, it will be appreciated that, where appropriate, principles applied herein to front end filters used in communication and radar systems can be applied to front end filters used in other high frequency electronic systems. It should also be understood that numerous modifications and variations are possible in accordance with the principles of the present invention. Accordingly, the scope of the invention is defined only by the following claims.

What is claimed is:

1. A system comprising:
    a printed wiring board (PWB); and
    a filter implemented in the PWB, the filter comprising:
        first and second ports,
        an inductor comprising a plurality of vias extending through the PWB and a plurality of conductors connecting the plurality of vias to provide a plurality of coils between the first and second ports, and
        a plurality of capacitors disposed within the PWB, wherein the filter is adapted to apply a first bandpass frequency response to a first signal passed from the first port to the second port and apply a second bandpass frequency response, different from the first bandpass frequency response, to a second signal passed from the second port to the first port to perform simultaneous bidirectional filtering within the system.

2. The system of claim 1, wherein at least one of the capacitors comprises a liquid crystal material that intersects with at least one of the vias within the PWB.

3. The system of claim 2, wherein the liquid crystal material is a nematic liquid crystal material.

4. The system of claim 1, wherein at least one of the capacitors comprises a dielectric gap separating at least one of the conductors.

5. The system of claim 1, wherein the PWB comprises a plurality of layers of dielectric substrate material bonded together.

6. The system of claim 1, further comprising a bias circuit adapted to apply a bias signal across the first and second ports, wherein the bias signal selectively tunes the first and second bandpass frequency responses.

7. The system of claim 6, wherein at least one of the capacitors comprises a liquid crystal material, wherein the bias signal adjusts a permittivity of the liquid crystal material.

8. The system of claim 1, further comprising:
    an antenna electrically coupled to the first port of the filter;
    a radio frequency (RF) mixer electrically coupled to the second port of the filter;
    wherein the antenna, the filter, and the RF mixer comprise a signal path adapted to provide a receive channel from the antenna through the filter to the RF mixer, and a transmit channel from the RF mixer through the filter to the antenna; and
    wherein the filter is adapted to apply different bandpass frequency responses to the receive and transmit channels.

9. The system of claim 8, further comprising a plurality of the signal paths.

10. A method comprising:
    providing a printed wiring board (PWB);
    providing a filter implemented in the PWB, the filter comprising:
        first and second ports,
        an inductor comprising a plurality of vias extending through the PWB and a plurality of conductors connecting the plurality of vias to provide a plurality of coils between the first and second ports, and
        a plurality of capacitors disposed within the PWB;
    receiving a first signal at the first port;
    applying, by the filter, a first bandpass frequency response to the received first signal to generate a first filtered signal;
    providing the first filtered signal to the second port;
    receiving a second signal at the second port;
    applying, by the filter, a second bandpass frequency response, different from the first bandpass frequency response, to the second signal to generate a second filtered signal simultaneous with the first filtered signal to perform simultaneous bidirectional filtering; and
    providing the second filtered signal to the first port.

11. The method of claim 10, wherein at least one of the capacitors comprises a liquid crystal material that intersects with at least one of the vias within the PWB.

12. The method of claim 11, wherein the liquid crystal material is a nematic liquid crystal material.

13. The method of claim 10, wherein at least one of the capacitors comprises a dielectric gap separating at least one of the conductors.

14. The method of claim 10, wherein the PWB comprises a plurality of layers of dielectric substrate material bonded together.

15. The method of claim 10, further comprising applying a bias signal across the first and second ports to selectively tune the first and second bandpass frequency responses.

16. The method of claim 15, wherein at least one of the capacitors comprises a liquid crystal material, wherein the bias signal adjusts a permittivity of the liquid crystal material.

17. The method of claim 10, wherein:
    the first port of the filter is electrically coupled to an antenna;
    the second port of the filter is electrically coupled to a radio frequency (RF) mixer;
    the antenna, the filter, and the RF mixer comprise a signal path; and
    the method further comprises:
        providing a receive channel from the antenna through the filter to the RF mixer, and a transmit channel from the RF mixer through the filter to the antenna, and
        applying, by the filter, different bandpass frequency responses to the receive and transmit channels.

18. The method of claim 17, further comprising providing a plurality of the filters in a plurality of the signal paths.

* * * * *